United States Patent [19]

Ishii

[11] Patent Number: 4,884,121
[45] Date of Patent: Nov. 28, 1989

[54] SEMICONDUCTOR DEVICE

[75] Inventor: Tatsuya Ishii, Hyogo, Japan

[73] Assignee: Mitsubishi Denki Kabushiki Kaisha, Tokyo, Japan

[21] Appl. No.: 49,264

[22] Filed: May 13, 1987

[30] Foreign Application Priority Data

May 22, 1986 [JP] Japan .................. 61-119518

[51] Int. Cl.⁴ .................. H01L 23/54; H01L 23/48
[52] U.S. Cl. .................. 357/68; 357/71
[58] Field of Search .................. 357/68, 71, 54

[56] References Cited

U.S. PATENT DOCUMENTS 3,509,433  4/1970  Schroeder .................. 357/68
3,631,307  12/1971  Naugler .................. 357/68
4,587,549  5/1986  Ushiku .................. 357/68

FOREIGN PATENT DOCUMENTS 0039378  3/1977  Japan .................. 357/68

OTHER PUBLICATIONS

Madland et al., *Integrated Circuit Engineering Basic Technology*, Boston Technical Publishers, Inc., 1966, (Chapters 2, 4 and 6).
*Symposium on VLSI Technology Digest of Technical Papers*, "Aluminum Plasma-CVD For VLSI Circuit Interconnections", by T. Ito et al., 1982, pp. 20-21.

Primary Examiner—Rolf Hille
Assistant Examiner—S. V. Clark
Attorney, Agent, or Firm—Lowe, Price, LeBlanc, Becker & Shur

[57] ABSTRACT

A semiconductor device comprises a semiconductor substrate having a convex portion and at least one conductive interconnection layer formed over the substrate. The interconnection layer has a contact region to be electrically connected. The convex portion of the substrate is formed in correspondence with the contact region, so that a step of the underlying layer for the interconnection layer is removed.

6 Claims, 3 Drawing Sheets

SEMICONDUCTOR DEVICE

BACKGROUND OF THE INVENTION

1. Field of the Invention

The present invention relates to a semiconductor device and more particularly, to an improvement of reliability of electric contact between a semiconductor substrate and an interconnection layer and/or between interconnection layers.

2. Description of the Prior Art

FIG. 1 is a schematic cross sectional view showing a portion of a conventional semiconductor memory device in which a metal interconnection such as aluminum is electrically connected to an impurity diffusion region on the surface of a semiconductor substrate. Only a contact portion of a transfer gate transistor included in a memory cell of the semiconductor memory device is shown in FIG. 1. In FIG. 1, the transfer gate transistor comprises a semiconductor substrate 1 formed of a monocrystal silicon or the like, an impurity diffusion layer 2 formed as an active region by diffusing impurities such as arsenic into a predetermined region on the surface of the semiconductor substrate 1, a first metal interconnection layer 4 formed of polycrystalline silicon or the like and serving as a gate electrode of the transfer gate transistor, an interlayer insulating film 5 formed on the surface of the semiconductor substrate 1 and on the first metal interconnection layer 4, a second metal interconnection layer 3 electrically connected to the impurity diffusion layer 2 through a through-hole (a contact hole) 8 which is formed in a predetermined region of the interlayer insulating film 5 and reaches the surface of the impurity diffusion layer 2, and a surface protecting film 6 formed on the second interconnection layer 3. The interlayer insulating film 5 electrically isolates the first metal interconnection layer 4 from the second metal interconnection layer 3. More specifically, the semiconductor memory device shown in FIG. 1 has a two-layer interconnection structure comprising the second metal interconnection layer 3 electrically connected to the impurity diffusion layer 2 and the first metal interconnection layer 4 serving as a gate electrode of the transfer gate transistor.

In the conventional semiconductor device with a two-layer interconnection structure as described above, the contact hole 8 must be formed in the interlayer insulating film 5 to electrically connect the second metal interconnection layer 3 to the impurity diffusion layer 2 on the surface of the semiconductor substrate 1.

Due to the contact hole 8, a step occurs in the interlayer insulating film 5. Therefore, there is a problem in step coverage characteristics in a step portion of the second metal interconnection layer 3. The metal interconnection 3 on the side wall of the contact hole 8 is generally thinner than that on the interlayer insulating film 5. As a result, there were some problems, such as increase in interconnection resistance and contact resistance and deterioration in reliability caused by disconnection of interconnection.

Step coverage characteristics of a metal interconnection layer in a step portion of an insulating film is discussed in an article by T. Ito et al., entitled "ALUMINUM PLASMA-CVD FOR VLSI CIRCUIT INTERCONNECTIONS", 1982 Symposium on VLSI Technology Digest of Technical Papers, pp. 20–21. As described in the document, when an aluminum film is deposited by plasma CVD or sputtering in the step portion of a silicon dioxide ($SiO_2$) film, the aluminum film formed on the side wall of the step is thinner than that formed on the planar portion.

SUMMARY OF THE INVENTION

An object of the present invention is to solve the above described problems of the conventional semiconductor device and to provide a semiconductor device capable of improving step coverage characteristics of an interconnection layer in a contact region, reducing interconnection resistance and contact resistance and improving reliability of the device.

In the semiconductor device according to the present invention, a convex portion is provided on the surface of the semiconductor substrate in the region in which electrical connection for an interconnection or interconnections is to be made. The convex portion compensates for a step in a contact hole o a through-hole, so that step coverage characteristics of the interconnection layers are improved.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
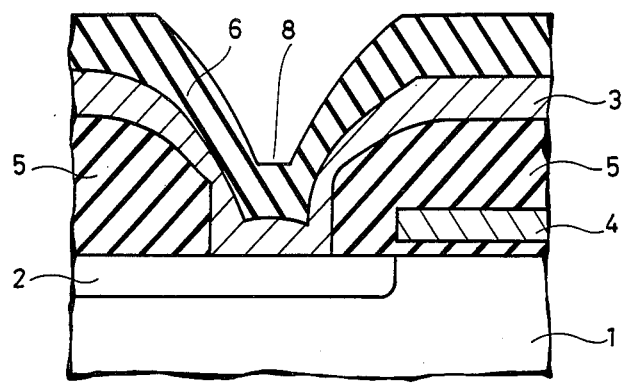
FIG. 1 is a cross sectional view showing a portion in the vicinity of the region of a contact hole of a conventional semiconductor device.
Figure 2:
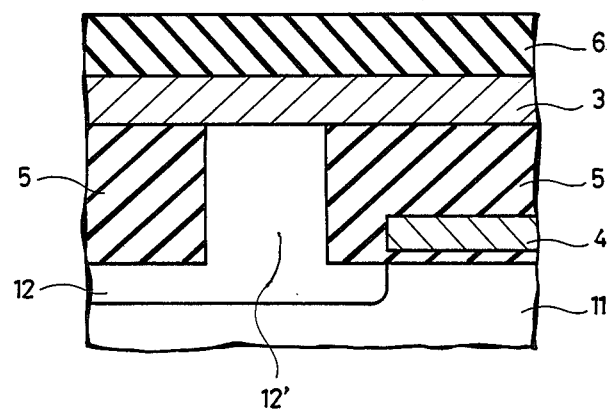
FIG. 2 is a cross sectional view showing a semiconductor device according to an embodiment of the present invention.

FIG. 2 is a cross sectional view showing a structure of a semiconductor device according to an embodiment of the present invention. In FIG. 2, portions identical or corresponding to portions of a conventional semiconductor device in FIG. 1 have the identical reference numerals.

Referring now to FIG. 2, a semiconductor device according to an embodiment of the present invention comprises a convex portion 12' formed on the surface of a semiconductor substrate 11 in the region in which a second metal interconnection layer 3 and an impurity diffusion layer 12 are electrically connected to each other. The height of the convex portion 12' is almost the same as the thickness of the interlayer insulating film 5.

In the structure as described above, a space of a contact hole formed in an interlayer insulating film 5 is filled with the convex portion 12' on the surface of the semiconductor substrate 11, so that a step in the region of the contact hole is removed. Therefore, since the surface of the interlayer insulating film 5 becomes planar, the second metal interconnection layer 3 can be formed on the planar surface, so that the problem of step coverage in a contact region can be solved.

Figure 3:
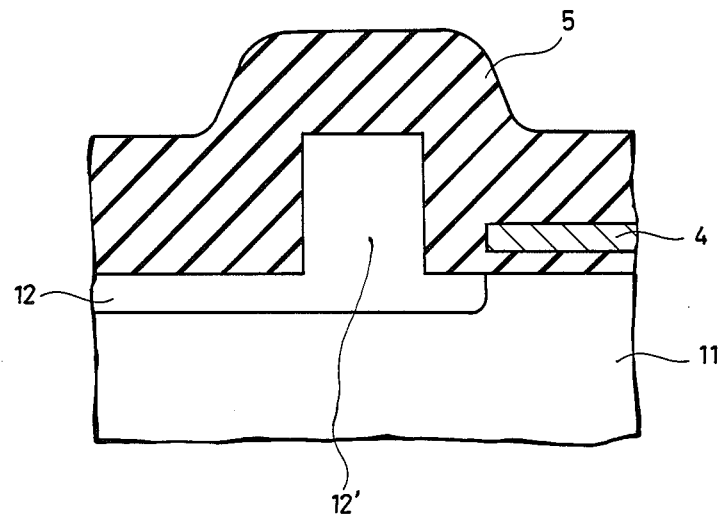
FIG. 3 is a diagram for explaining a method of manufacturing the semiconductor device according to an embodiment of the present invention.

FIG. 3 is a diagram for explaining a method of manufacturing the semiconductor device according to the present invention. Referring now to FIG. 3, description is now made on the manufacturing method of the semiconductor device according to the present invention.

Only the region in which the contact hole is to be formed on the surface of the semiconductor substrate 11 is masked by an etching mask (not shown) such as resist. Then, the surface of the semiconductor substrate 11 is etched by anisotropic etching such as reactive ion etching utilizing the etching mask as a mask, so that a convex portion 12' is formed. The height of the convex portion 12' is made almost the same as the thickness of an interlayer insulating film subsequently formed. Thereafter, a first metal interconnection layer 4 serving as a gate electrode of a transfer gate transistor, a capacitor, a resistor and the like required for the device in the case of a semiconductor memory device are formed by CVD, ion implantation or the like, respectively. When the impurity diffusion layer 12 is formed, impurities are also diffused into the convex portion 12'. Then, the interlayer insulating film 5 is formed by CVD or the like to cover the exposed entire surface, which is shown in FIG. 3. The surface of the interlayer insulating film 5 is etched until the surface of the convex portion 12' is exposed using planarizing techniques such as etch back technique. Thus, the surfaces of the interlayer insulating film 5 and the convex portion 12' become the same level, and the step of the underlying layer for the second metal interconnection layer is eliminated, so that the second metal interconnection layer can be formed without paying attention to step coverage.

Figure 4:
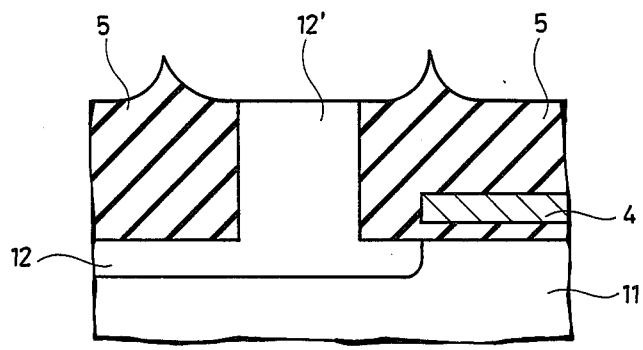
FIG. 4 is a diagram for explaining another method of manufacturing a semiconductor device according to another embodiment of the present invention.

FIG. 4 is a cross sectional view for explaining another method of manufacturing the semiconductor device according to the present invention. In the manufacturing method shown in FIG. 4, processes prior to formation of the interlayer insulating film 5 are the same as those described referring to FIG. 3. The region which corresponds to the convex portion 12' of the interlayer insulating film 5 and is made wider than the actual convex portion 12' is removed by isotropic etching such as wet etching, so that an opening reaching the surface of the convex portion 12' is provided. Thereafter, the surface of the interlayer insulating film 5 is made smooth by heat treatment or the like, so that the step of the underlying layer for the second metal interconnection layer is reduced.

Figure 5:
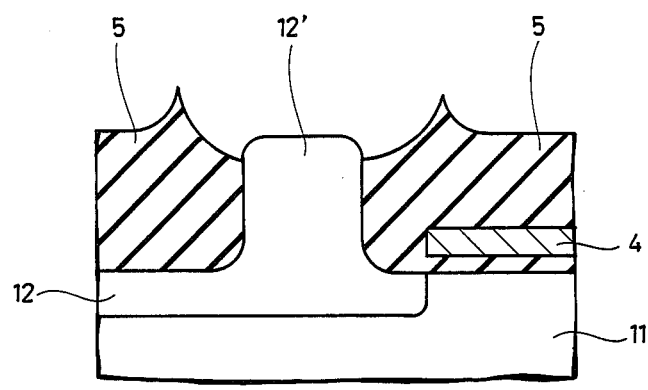
FIG. 5 is a diagram for explaining a method of manufacturing a semiconductor device according to still another embodiment of the present invention.

FIG. 5 is a diagram for explaining still another method of manufacturing the semiconductor device according to the present invention. In the manufacturing method shown in FIG. 5, the convex portion 12' is formed in a predetermined region on the surface of the semiconductor substrate 11 by etching and then, the upper surface of the convex portion 12' is changed from a planar shape to a curved shape by wet etching or the like. Thereafter, the interlayer insulating film 5 is formed and then, the upper surface of the convex portion 12' in a curved shape is exposed. Thus, the contact area of the second metal interconnection layer with the convex portion 12' is increased, so that contact resistance can be reduced.

Although an embodiment in which the present invention is applied to a semiconductor memory device has been described, the present invention can be applied to all the semiconductor device in which a contact hole must be formed.

Figure 6:
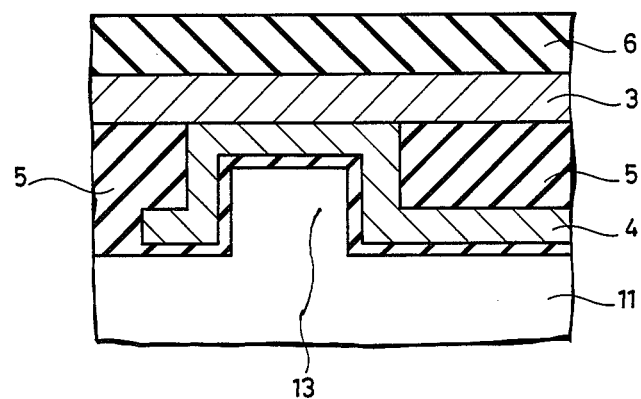
FIG. 6 is a diagram showing a structure of a semiconductor device according to another embodiment of the present invention.

Although in the above described embodiments, a metal interconnection is electrically connected to a semiconductor substrate, the metal interconnection may be connected to another metal interconnection, in which case the present invention is also applicable. For example, in a semiconductor device with a two-layer interconnection structure as shown in FIG. 6, a convex portion 13 may be provided in the semiconductor substrate 11 under a contact region of the first metal interconnection layer 4 with the second metal interconnection layer 3, to form the first metal interconnection layer 4 in a convex shape. In this case, the underlying first metal interconnection layer 4 is formed in a convex shape by forming a convex portion in the semiconductor substrate 11. However, since polycrystalline silicon forming the first metal interconnection layer 4 is superior in step coverage for the step of the underlying layer, there occurs no problem even if the underlying semiconductor substrate 11 is formed in a convex shape.

As described in the foregoing, according to the present invention, since a convex portion is provided in the semiconductor substrate in a contact region for electrical connection of an interconnection or interconnections, a reliable semiconductor device can be obtained in which a step of the underlying layer to an interconnection can be largely reduced, the problem of step coverage of the interconnection layer in the underlying step portion can be removed, and interconnection resistance and contact resistance are not increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate having a major surface, an active region within said substrate and a protruding portion of said active region having a substantially uniform cross section extending above said major surface; and
    a conductive interconnection layer formed over said semiconductor substrate;
    said interconnection layer having a contact region located above and electrically connected to said protruding portion of said active region for providing an electrical connection to said active region; and
    an interlayer insulating layer interposed between said major surface of said semiconductor substrate and said interconnection layer so that the height of said protruding portion is substantially equal to a thickness of said interlayer insulating layer at said protruding portion.

2. A semiconductor device in accordance with claim 1 wherein said protruding portion of said active region has a substantially planar upper contact surface which is in electrical contact with said contact region of said conductive interconnection layer.

3. A semiconductor device in accordance with claim 1 wherein said protruding portion of said subtrate forms an electrode and interconnection layer of a transistor.

4. A semiconductor device in accordance with claim 1 wherein said protruding portion of said active region forms a resistor.

5. A semiconductor device comprising:
a semiconductor substrate having a protruding portion of substantially uniform cross section extending above a major surface of said substrate;
a first interlayer insulating layer formed on said major surface of said semiconductor substrate and covering said protruding portion;
a first metal interconnection layer formed on said first interlayer insulation layer, said first metal interconnection layer having a convex region formed on said protruding portion of said semiconductor substrate;
a second interlayer insulating layer formed on said first metal interconnection layer in locations adjacent said convex region of said first metal interconnection layer, an upper surface of said second interlayer insulating layer formed substantially coplanar with an upper surface of said convex region of said first metal interconnection layer; and
a second metal interconnection layer of substantially uniform thickness, formed on said second interlayer insulating layer and said first metal interconnection layer, said second interconnection layer having a contact region electrically connected to said first interconnection layer at a region above said protruding portion of said semiconductor substrate.

6. A semiconductor device in accordance with claim 5 wherein said protruding region of said first metal interconnection layer has a substantially planar contact surface in electrical contact with said second metal interconnection layer.

* * * * *